United States Patent
Elison et al.

(10) Patent No.: US 9,177,889 B2
(45) Date of Patent: Nov. 3, 2015

(54) IMPLEMENTING MICROSCALE THERMOACOUSTIC HEAT AND POWER CONTROL FOR PROCESSORS AND 3D CHIPSTACKS

(71) Applicant: International Business Machines Corporation, Armonk, NY (US)

(72) Inventors: Bret P. Elison, Rochester, MN (US); Phillip V. Mann, Rochester, MN (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 13/624,051

(22) Filed: Sep. 21, 2012

(65) Prior Publication Data

US 2014/0083094 A1   Mar. 27, 2014

(51) Int. Cl.
| | |
|---|---|
| H01L 23/34 | (2006.01) |
| H01L 23/467 | (2006.01) |
| F03G 7/00 | (2006.01) |
| H01L 23/367 | (2006.01) |
| F25B 9/14 | (2006.01) |
| F28D 21/00 | (2006.01) |

(52) U.S. Cl.
CPC .............. *H01L 23/467* (2013.01); *F03G 7/002* (2013.01); *F25B 9/145* (2013.01); *H01L 23/34* (2013.01); *H01L 23/3672* (2013.01); *F02G 2243/54* (2013.01); *F28D 2021/0028* (2013.01); *F28D 2021/0029* (2013.01); *H01L 2924/0002* (2013.01)

(58) Field of Classification Search
CPC ... F03G 7/00; F03G 7/002; F28D 2021/0028; F28D 2021/0029; F02G 2243/50; F02G 2243/52; F02G 2243/54; F25B 9/145
See application file for complete search history.

(56) References Cited

U.S. PATENT DOCUMENTS

| | | | |
|---|---|---|---|
| 5,303,555 A | 4/1994 | Chrysler et al. | |
| 5,673,561 A * | 10/1997 | Moss | 62/6 |
| 6,725,670 B2 * | 4/2004 | Smith et al. | 62/6 |
| 7,017,351 B2 | 3/2006 | Hao et al. | |
| 7,062,921 B2 | 6/2006 | Jeng et al. | |
| 7,202,562 B2 * | 4/2007 | Farrar | 257/721 |
| 7,263,837 B2 | 9/2007 | Smith | |
| 7,278,271 B2 | 10/2007 | Chou et al. | |
| 7,489,034 B2 | 2/2009 | Farrar | |
| 2003/0097838 A1 * | 5/2003 | Yazawa et al. | 60/527 |
| 2004/0231341 A1 * | 11/2004 | Smith | 62/6 |
| 2005/0078447 A1 | 4/2005 | Hamann et al. | |
| 2006/0266052 A1 * | 11/2006 | Hsing et al. | 62/6 |
| 2008/0120981 A1 | 5/2008 | Dean et al. | |
| 2010/0085713 A1 * | 4/2010 | Balandin et al. | 361/705 |

* cited by examiner

*Primary Examiner* — Kenneth Bomberg
*Assistant Examiner* — Xiaoting Hu
(74) *Attorney, Agent, or Firm* — Joan Pennington

(57) ABSTRACT

A method and apparatus are provided for implementing microscale thermoacoustic heat and power control for processors and three dimensional (3D) chip stacks. A thermoacoustic heat engine is integrated with a 3D chip-stack and high power processors. The thermoacoustic heat engine is used in cooperation with a heat sink associated with the 3D chip-stack. Predefined connecting layers connect the 3D chip-stack to a cooling end of a thermoacoustic stack of the thermoacoustic heat engine, allowing the cooled end of the resonator to maintain temperature within the 3D chip-stack and to increase the efficiency of the heat sink.

16 Claims, 4 Drawing Sheets

IMPLEMENTING MICROSCALE THERMOACOUSTIC HEAT AND POWER CONTROL FOR PROCESSORS AND 3D CHIPSTACKS

FIELD OF THE INVENTION

The present invention relates generally to the data processing field, and more particularly, relates to method and apparatus for implementing microscale thermoacoustic heat and power control for processors and three dimensional (3D) chip-stacks.

DESCRIPTION OF THE RELATED ART

Cooling solutions for 3D chip-stacks are limited. Many solutions rely on heat spreaders within the chip-stack, while a large heat sink does the bulk of the work.

Known heat spreaders are limited by manufacturing capabilities, and other materials required that are necessary but poor at conducting heat. In addition, larger chip-stacks and higher power chip-stacks will require more thermal dissipation as power demands increase.

A need exists for an efficient and effective method and apparatus for implementing heat and power control for processors and three dimensional (3D) chip-stacks. It is desirable to provide such structures that have enhanced heat conducting capability.

SUMMARY OF THE INVENTION

Principal aspects of the present invention are to provide a method and apparatus for implementing microscale thermoacoustic heat and power control for processors and three dimensional (3D) chip stacks. Other important aspects of the present invention are to provide such method and apparatus substantially without negative effects and that overcome many of the disadvantages of prior art arrangements.

In brief, a method and apparatus are provided for implementing microscale thermoacoustic heat and power control for processors and three dimensional (3D) chip stacks. A thermoacoustic heat engine is integrated with a 3D chip-stack and high power processors. The thermoacoustic heat engine is used in cooperation with a heat sink associated with the 3D chip-stack. Predefined connecting layers connect the 3D chip-stack to a first end of a thermoacoustic stack of the thermoacoustic heat engine, allowing a cooled end of the resonator to maintain temperature within the 3D chip-stack and to increase the efficiency of the heat sink.

In accordance with features of the invention, the predefined connecting layers include substrate or bond layers formed of a highly conductive material such as graphene.

In accordance with features of the invention, the predefined connecting layers connect the 3D chip-stack providing heat dissipation inside the chip stack and allowing the cooled end of the resonator to efficiently and effectively maintain temperature within the 3D chip-stack.

In accordance with features of the invention, under low load or idle operation the thermoacoustic heat engine can allow residual heat to force resonation of the transformer providing waste heat power generation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing microscale thermoacoustic heat and power control for processors and three dimensional (3D) chip stacks.

Figure 1:
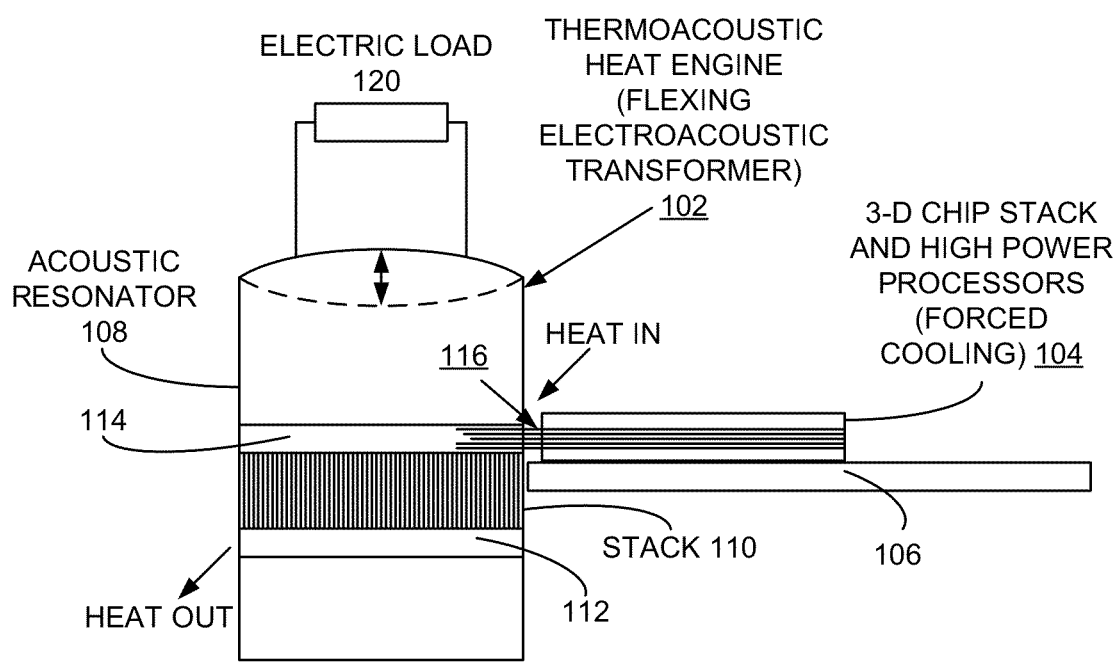
FIG. 1 is an elevated view not to scale schematically illustrating example apparatus including a thermoacoustic heat engine integrated with a three dimensional (3D) chip stack and high power processors for implementing heat and power control for processors and three dimensional (3D) chip stacks in accordance with the preferred embodiment.

Referring now to FIG. 1, there is schematically shown example cooling apparatus for implementing heat and power control for processors and three dimensional (3D) chip stacks in accordance with the preferred embodiment generally designated by the reference character 100. Control apparatus 100 includes a thermoacoustic heat engine 100 integrated with a three dimensional (3D) chip stack and high power processors 104.

In FIG. 1, the thermoacoustic heat engine 102 or flexing electroacoustic transformer is shown enlarged for conceptual explanation. The thermoacoustic heat engine 102 is manufactured with the processors 104 and 3D chip stack 104 and used in cooperation with a mounted heat sink 106 sink associated with the 3D chip-stack. The thermoacoustic heat engine 102 includes an acoustic resonator 108 and a thermoacoustic stack 110.

As shown in FIG. 1 with control apparatus 100 implementing microscale thermoacoustic heat control, a lower end 112 of the thermoacoustic stack 110 is the hot end transferring heat out as indicated by an arrow labeled HEAT OUT. An upper end 114 of the thermoacoustic stack 110 is the cooling end receiving heat from the chip stack 104 as indicated by an arrow labeled HEAT IN.

Predefined connecting layers 116 connect the 3D chip-stack 104 to the cooling end 114 of the thermoacoustic stack 110 of the thermoacoustic heat engine 102, allowing a cooled end 114 of the resonator 108 to maintain temperature within the 3D chip-stack 10 and to increase the efficiency of the heat sink 106. Power is applied to the thermoacoustic heat engine 102 as indicated by electric load 120 for implementing microscale thermoacoustic heat control.

The predefined connecting layers 116 extending between the 3D chip-stack 104 to the cooling end 114 of the thermoacoustic stack 110 include substrate or bond layers formed of a highly conductive material such as graphene. The connection with predefined connecting layers 116 to the thermoacoustic heat engine 102 provide heat dissipation inside the chip stack 104 and allowing the cooled end 114 of the resonator 108 to efficiently and effectively maintain temperature within the 3D chip-stack.

Figure 2:
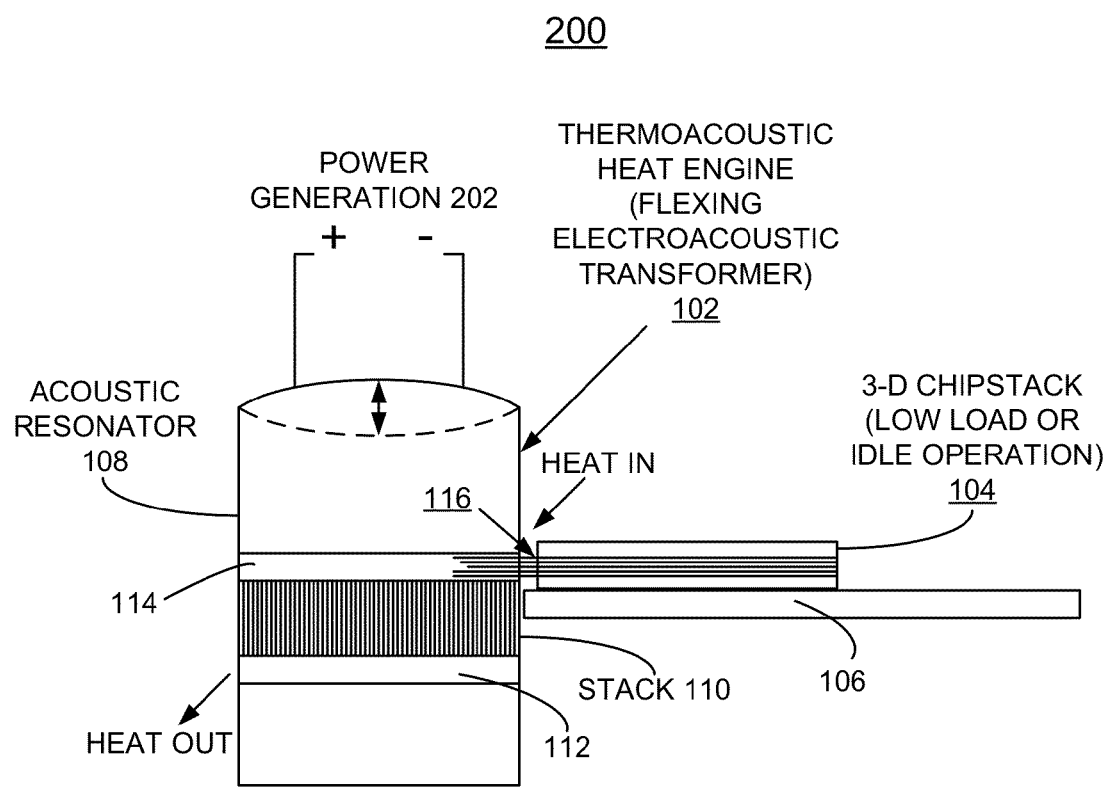
FIG. 2 is an elevated view not to scale schematically illustrating the example apparatus of FIG. 1 for implementing power control for processors and 3D chip stacks including waste heat power generation under low load or idle operation in accordance with the preferred embodiment.

In accordance with features of the invention, under low load or idle operation the thermoacoustic heat engine can allow residual heat to force resonation of the transformer providing waste heat power generation, for example, as illustrated and described with respect to FIG. 2.

Referring now to FIG. 2, there is shown control apparatus 200 implementing power control for processors and 3D chip stacks including waste heat power generation under low load or idle operation in accordance with the preferred embodiment. The illustrated thermoacoustic heat engine 102, under low load or idle operation of the 3D chip-stack 104 allows residual heat to force resonation of the transformer providing waste heat power generation as indicated by power generation 202.

In FIG. 2, under low load or idle operation of control apparatus 200, the upper end 114 of the thermoacoustic stack 110 is the hot end receiving low or no heat from the chip stack 104 as indicated by at arrow HEAT IN and the lower end 112 of the thermoacoustic stack 110 is the cool end, providing waste heat power generation at power generation 202.

Figure 3:
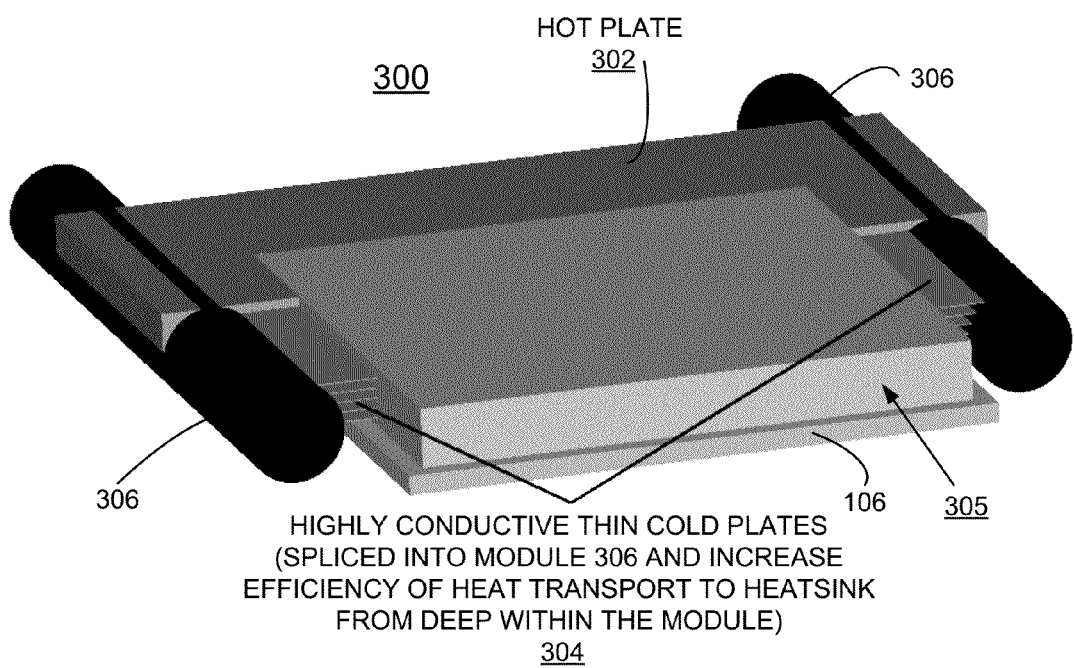
FIG. 3 is a perspective view not to scale schematically illustrating an example hot plate in direct contact with a heat sink associated the thermoacoustic heat engine of FIG. 1 for implementing heat and power control for processors and 3D chip stacks in accordance with the preferred embodiment.

Referring now to FIG. 3 there is shown apparatus 300 including an example hot plate 302 provided in direct contact with the heat sink 106 associated the 3D chip stack 104 and thermoacoustic heat engine 102 of control apparatus 100 for implementing heat and power control for processors and 3D chip stacks in accordance with a preferred embodiment. The illustrated embodiment of apparatus 300 includes a plurality of highly conductive thin cold plates 304, spliced into a module 305 for example, containing apparatus 100. The hot plate 302 is disposed in direct contact with the heat sink 106 mounted by a pair of support members 306. The hot plate 302 potentially improves heat flux with increased surface area. The plurality of highly conductive thin cold plates 304 increase efficiency of heat transport to the heat sink 106 from deep within the module 305.

Figure 4:
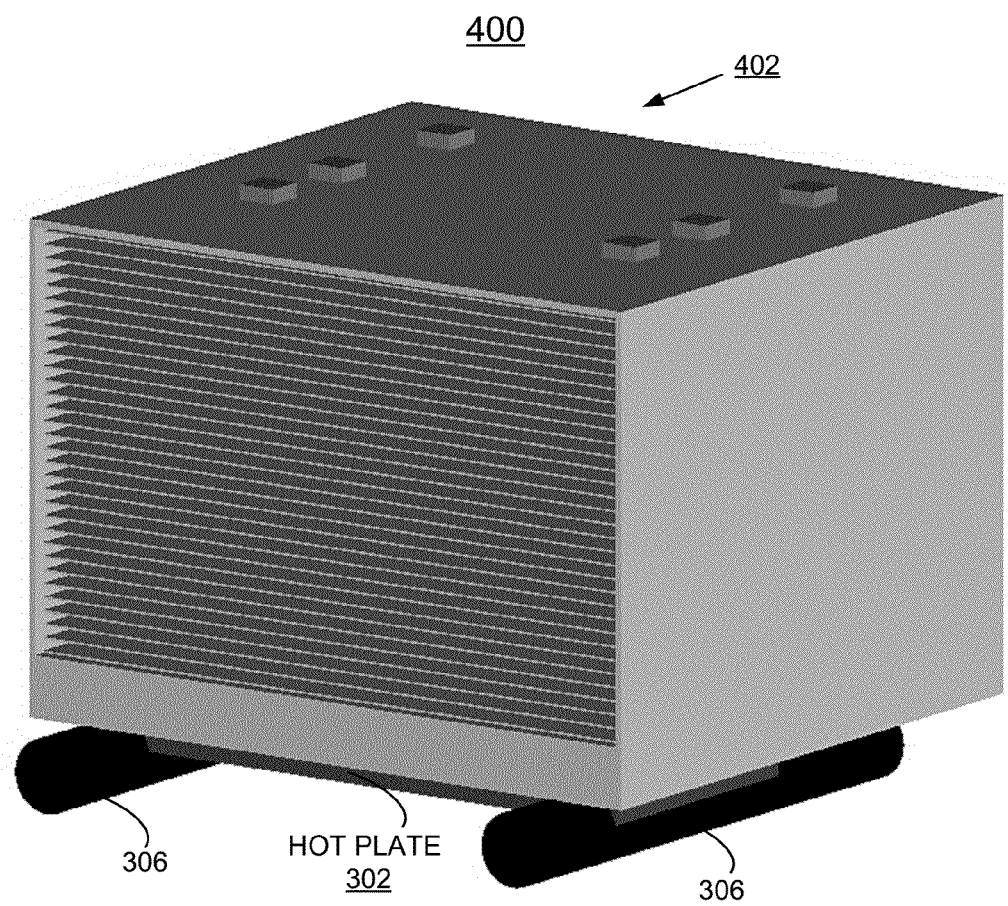
FIG. 4 is a perspective view not to scale schematically illustrating an example surface mounted heat sink used with a server system including the thermoacoustic heat engine of FIG. 1 for implementing heat and power control for processors and 3D chip stacks in accordance with the preferred embodiment.

Referring now to FIG. 4, there is shown apparatus 400 illustrating an example surface mounted heat sink 402, for example used with a server system including control apparatus 100 of FIG. 1 with thermoacoustic heat engine 102 for implementing heat and power control for processors and 3D chip stacks in accordance with the preferred embodiment.

While the present invention has been described with reference to the details of the embodiments of the invention shown in the drawing, these details are not intended to limit the scope of the invention as claimed in the appended claims.

What is claimed is:

1. An apparatus for implementing microscale thermoacoustic heat and power control for processors and three dimensional (3D) chip stacks comprising:
    a three dimensional (3D) chip stack;
    a heat sink associated with said 3D chip-stack;
    a thermoacoustic heat engine integrated with said 3D chip-stack;
    said thermoacoustic heat engine being used in cooperation with said heat sink associated with the 3D chip-stack; said thermoacoustic heat engine including an acoustic resonator connected to a thermoacoustic stack; and
    a plurality of predefined connecting layers spliced into said 3D chip-stack and directly connecting said 3D chip-stack to a first cool end of said thermoacoustic stack of said thermoacoustic heat engine, allowing said first cool end of said resonator to maintain temperature within said 3D chip-stack and to increase the efficiency of the heat sink.

2. The apparatus as recited in claim 1 wherein said predefined connecting layers are formed of a highly conductive material.

3. The apparatus as recited in claim 2 wherein said highly conductive material includes graphene.

4. The apparatus as recited in claim 2 wherein said predefined connecting layers include highly conductive thin fins.

5. The apparatus as recited in claim 1 wherein said thermoacoustic heat engine, under low load or idle operation allows residual heat to force resonation of the transformer providing waste heat power generation.

6. The apparatus as recited in claim 1 further includes a hot plate in direct contact with said heat sink associated with said 3D chip-stack.

7. The apparatus as recited in claim 6 wherein said plurality of predefined connecting layers includes a plurality of highly conductive cold plates extending into the 3D chip-stack and provided in contact with said hot plate and said heat sink associated with said 3D chip-stack.

8. The apparatus as recited in claim 1 wherein said heat sink associated with the 3D chip-stack includes a surface mounted heat sink used with a server system.

9. A method for implementing microscale thermoacoustic heat and power control for processors and three dimensional (3D) chip stacks comprising:
    integrating a thermoacoustic heat engine with a 3D chip-stack;
    providing a heat sink associated with the 3D chip-stack used in cooperation with said thermoacoustic heat engine;
    providing said thermoacoustic heat engine including an acoustic resonator connected to a thermoacoustic stack; and
    providing a plurality of predefined connecting layers spliced into said 3D chip-stack and directly connecting the 3D chip-stack to a first cool end of said thermoacoustic stack of said thermoacoustic heat engine, allowing said first cool end of said resonator to maintain temperature within the 3D chip-stack and to increase the efficiency of the heat sink.

10. The method as recited in claim 9 wherein providing said plurality of said predefined connecting layers includes forming said plurality of said predefined connecting layers of a highly conductive material.

11. The method as recited in claim 10 wherein said highly conductive material includes graphene.

12. The method as recited in claim 10 wherein said predefined connecting layers include highly conductive thin fins.

13. The method as recited in claim 9 wherein said thermoacoustic heat engine, under low load or idle operation of the 3D chip-stack allows residual heat to force resonation of the transformer providing waste heat power generation.

14. The method as recited in claim 9 includes providing a hot plate in direct contact with said heat sink associated with said 3D chip-stack.

15. The method as recited in claim 14 wherein providing said plurality of said predefined connecting layers includes providing a plurality of highly conductive cold plates extending into the 3D chip-stack and provided in contact with said hot plate and said heat sink associated with said 3D chip-stack.

16. The method as recited in claim 9 wherein providing said heat sink associated with the 3D chip-stack includes providing a surface mounted heat sink used with a server system.

* * * * *